United States Patent
Cheng

(10) Patent No.: US 12,268,015 B2
(45) Date of Patent: Apr. 1, 2025

(54) SEMICONDUCTOR STRUCTURES

(71) Applicant: ENKRIS SEMICONDUCTOR, INC., Jiangsu (CN)

(72) Inventor: Kai Cheng, Jiangsu (CN)

(73) Assignee: ENKRIS SEMICONDUCTOR, INC., Jiangsu (CN)

(*) Notice: Subject to any disclaimer, the term of this patent is extended or adjusted under 35 U.S.C. 154(b) by 573 days.

(21) Appl. No.: 17/613,628

(22) PCT Filed: Jul. 21, 2020

(86) PCT No.: PCT/CN2020/103334
§ 371 (c)(1),
(2) Date: Nov. 23, 2021

(87) PCT Pub. No.: WO2022/016390
PCT Pub. Date: Jan. 27, 2022

(65) Prior Publication Data
US 2022/0320326 A1   Oct. 6, 2022

(51) Int. Cl.
*H10D 62/824* (2025.01)
*H10D 30/47* (2025.01)
*H10D 62/815* (2025.01)
*H10D 62/85* (2025.01)

(52) U.S. Cl.
CPC ..... *H10D 30/4738* (2025.01); *H10D 62/8164* (2025.01); *H10D 62/824* (2025.01); *H10D 62/8503* (2025.01)

(58) Field of Classification Search
CPC ............... H01L 29/7785; H01L 29/155; H01L 29/2003; H01L 29/205; H01L 29/7786
See application file for complete search history.

(56) References Cited

U.S. PATENT DOCUMENTS

| 10,388,753 B1 | 8/2019 | Armstrong et al. |
| 2017/0318632 A1* | 11/2017 | Simin ............... H01L 27/15 |
| 2022/0029007 A1* | 1/2022 | Chen ............... H01L 29/2003 |

FOREIGN PATENT DOCUMENTS

| CN | 105932041 A | 9/2016 |
| CN | 108511522 A | 9/2018 |
| CN | 110600547 A | 12/2019 |
| WO | 2013185089 A1 | 12/2013 |

OTHER PUBLICATIONS

ISA State Intellectual Property Office of the People's Republic of China, International Search Report Issued in Application No. PCT/CN2020/103334, Apr. 26, 2021, WIPO, 4 pages.
ISA State Intellectual Property Office of the People's Republic of China, Written Opinion of the International Searching Authority Issued in Application No. PCT/CN2020/103334, Apr. 26, 2021, WIPO, 6 pages.(Submitted with Machine/Partial Translation).

* cited by examiner

*Primary Examiner* — Elias Ullah
(74) *Attorney, Agent, or Firm* — The Small Patent Law Group LLC; Christopher R. Carroll

(57) ABSTRACT

The present application provides a semiconductor structure. The semiconductor structure includes a channel layer and a barrier layer provided on the channel layer. The barrier layer includes multiple barrier layers arranged in a stack, the multiple barrier sub-layers include at least three barrier sub-layers, and Al component proportions of the multiple barrier sub-layers vary along a growth direction of the barrier layer for at least one up-and-down fluctuation.

19 Claims, 7 Drawing Sheets

SEMICONDUCTOR STRUCTURES

CROSS REFERENCE TO RELATED APPLICATION

This application is a national phase entry of International Patent Application No. PCT/CN2020/103334 (filed 21-Jul.-2020), the entire disclosure of which is incorporated herein by reference.

TECHNICAL FIELD

This present application relates to the field of semiconductor, and in particular, to a semiconductor structure.

BACKGROUND

Semiconductor material such as gallium nitride has become a current research hotspot due to its characteristics such as large forbidden band width, high saturation drift speed of electrons, high breakdown field strength, good thermal conductivity, and so on. In an aspect of electronic devices, gallium nitride material is more suitable for manufacturing high-temperature, high-frequency, high-voltage, and high-power devices than silicon and gallium arsenide. Therefore, gallium-nitride-based electronic devices have good application prospects.

Due to strong two-dimensional electron gas in the AlGaN/GaN heterostructure, the AlGaN/GaN HEMT (High Electron Mobility Transistor) is usually a depletion device, which makes it difficult to implement an enhancement device. For depletion devices, applications in many situations have certain limitations, for example, in the application of power switching devices, enhanced (normally-off) switching devices are required. Enhanced gallium nitride switching devices are mainly used in high-frequency devices, power switching devices, digital circuits and so on, and its research has very important significance.

To realize enhanced gallium nitride switching devices, a suitable method is needed to reduce a channel carrier concentration under a gate when a gate voltage is zero. The currently reported methods include etching a grooved gate, injecting fluorine to a barrier layer under a gate, a thin barrier layer, and so on. However, a thin barrier layer will cause electrons to tunnel through the barrier layer, thereby reducing a reliability of the device or making the device completely inoperable. Therefore, there is a need for a semiconductor structure that can help minimize or eliminate problems of forward leakage in devices using thin barrier layers.

SUMMARY

The present application provides a semiconductor structure, which can avoid forward leakage and improve stability and reliability of a semiconductor device.

To achieve the foregoing objective, an embodiment of the present application provides a semiconductor structure. The semiconductor structure includes a channel layer and a barrier layer provided on the channel layer, where the barrier layer includes multiple barrier sub-layers arranged in a stack, and the multiple barrier sub-layers include at least three barrier sub-layers, and Al (aluminum) component proportions of the multiple barrier sub-layers vary along a growth direction of the barrier layer for at least one up-and-down fluctuation. In this technical solution, one up-and-down fluctuation includes variations that the Al component proportions of the multiple barrier sub-layers vary from large to small, and then from small to large along the growth direction of the barrier layer; or variations that the Al component proportions of the multiple barrier sub- layers vary from small to large, and then from large to small along the growth direction of the barrier layer. Multiple up-and-down fluctuations include recurrent up-and-down fluctuation variations that the Al component proportions of the multiple barrier sub-layers vary from large to small, then from small to large, and continue to vary from large to small, and so on, along the growth direction of the barrier layer; or recurrent up-and-down fluctuation variations that the Al component proportions of the multiple barrier sub-layers vary from small to large, then from large to small, and continue to vary from small to large, and so on, along the growth direction of the barrier layer. A number of the multiple up-and-down fluctuations is the greater value between a number of Al component proportions discontinuous variations from small to large and a number of Al component proportions discontinuous variations from large to small in the multiple barrier sub-layers along the growth direction of the barrier layer.

Optionally, the Al component proportions of three adjacent barrier sub-layers among the multiple barrier sub-layers are different between each other.

Optionally, the multiple barrier sub-layers include at least four barrier sub-layers, and the Al component proportions of the multiple barrier sub-layers vary along the growth direction of the barrier layer for at least two up-and-down fluctuations.

Optionally, amplitudes of the at least two up-and-down fluctuations gradually increase along the growth direction of the barrier layer.

Optionally, the Al component proportions of the multiple barrier sub-layer are from 0 to 1.

Optionally, an Al component proportion of a barrier sub-layer of the multiple barrier sub-layers that is closest to the channel layer among the multiple barrier sub-layers is greater than zero.

Optionally, the semiconductor structure includes a substrate; a nucleation layer; a buffer layer; wherein the substrate, the nucleation layer, the buffer layer, the channel layer, and the barrier layer are arranged in a stack, where a plurality of sources, a plurality of drains, and a plurality of gates are provided on the barrier layer.

Optionally, a material of the substrate includes one or more of silicon, silicon carbide, sapphire, GaN, AlN, lithium niobate, or silicon on insulator.

Optionally, a material of the buffer layer includes one or more of AlN, GaN, AlGaN or InGaN.

Optionally, a material of at least one of the multiple barrier sub-layers that contains an Al component includes AlGaN or AlInGaN.

Optionally, a material of the channel layer includes GaN.

In the semiconductor structure of the above embodiment, by providing at least three barrier sub-layers, the Al component proportions of the multiple barrier sub-layers vary along the growth direction of the barrier layer for at least one fluctuation, and an energy band of the semiconductor structure forms one or more quantum wells in the barrier layer to avoid forward leakage.

DETAILED DESCRIPTION OF THE EMBODIMENTS

Various embodiments will be described in detail herein, examples of which are illustrated in the accompanying drawings. When the following descriptions involve the drawings, like numerals in different drawings represent like or similar elements unless stated otherwise. The implementations described in the following example embodiments do not represent all implementations consistent with the present application. Rather, they are merely examples of devices and methods consistent with some aspects of the present disclosure as detailed in the appended claims.

The terms used in the present application are for the purpose of describing particular examples only, and are not intended to limit the present disclosure. Unless otherwise defined, the technical or scientific terms used in this application shall have the usual meanings understood by those with ordinary skills in the field to which the present invention belongs. Similar words such as "a" or "an" used in the specification and claims of this application do not mean a quantity limit, but mean that there is at least one. "Include" or "comprise" and other similar words mean that the elements or items before "include" or "comprise" cover the elements or items listed after "include" or "comprise" and their equivalents, and do not exclude other elements or objects. Similar words such as "connect" or "link" are not limited to physical or mechanical connections, and may include electrical connections, whether direct or indirect. "Multiple" includes two and is equivalent to at least two. Terms like "a", "the" and "said" in their singular forms in the specification and the appended claims of the present application are also intended to include plurality, unless clearly indicated otherwise in the context. It is to be understood that the term "and/or" as used herein is and includes any and all possible combinations of one or more of associated listed items.

Figure 1:
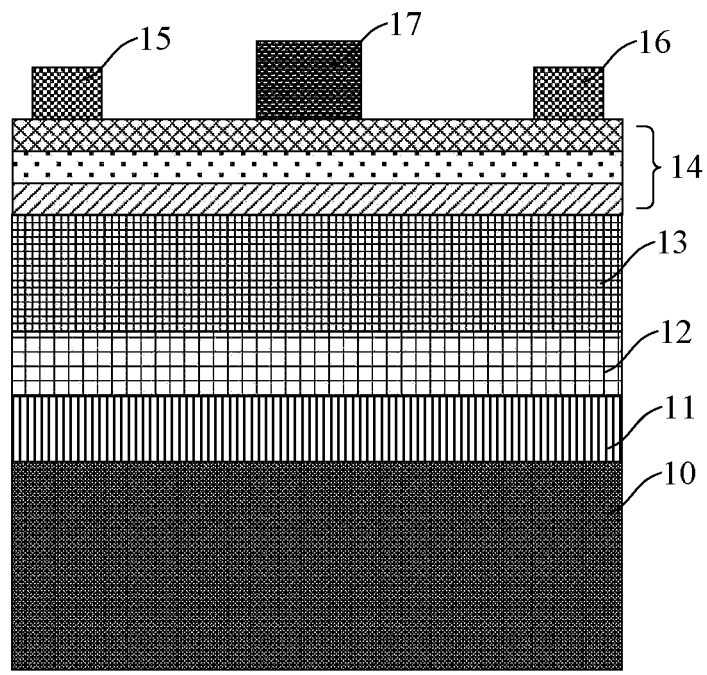
FIG. 1 is a cross-sectional schematic diagram of a semiconductor structure according to embodiment 1 of the present application.
Figure 4:
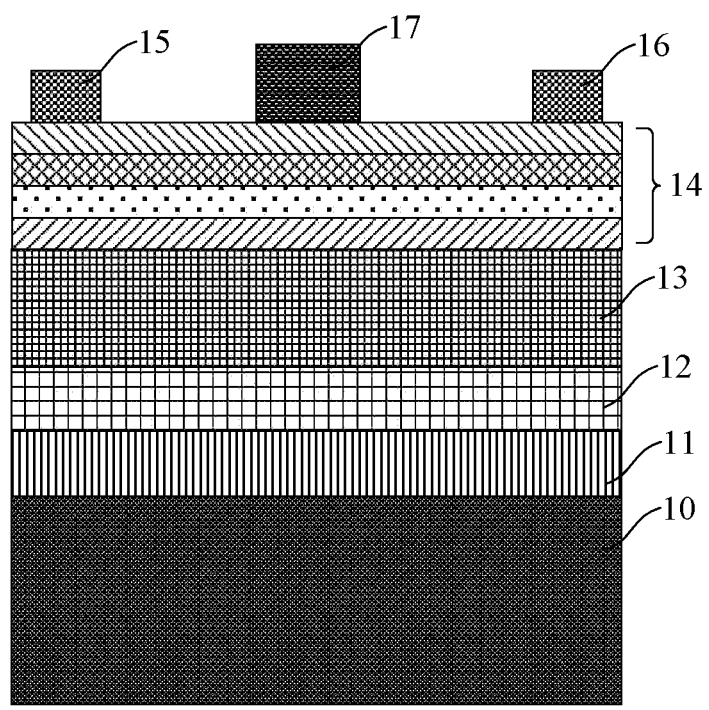
FIG. 4 is a cross-sectional schematic diagram of a semiconductor structure according to embodiment 2 of the present application.
Figure 8:
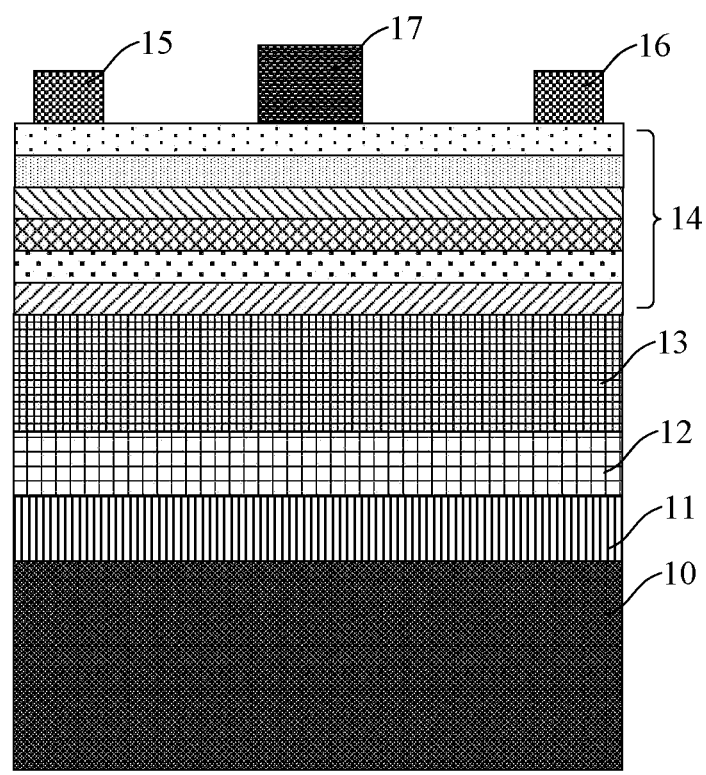
FIG. 8 is a cross-sectional schematic diagram of a semiconductor structure according to embodiment 3 of the present application.

Embodiments of the present application provide a semiconductor structure. As shown in FIG. 1, FIG. 4, and FIG. 8, the semiconductor structure includes a channel layer 13 and a barrier layer 14 provided on the channel layer 13. The barrier layer 14 includes multiple barrier sub-layers arranged in a stack, the multiple barrier sub-layers include at least three barrier sub-layers, Al component proportions of the multiple barrier sub-layers vary along a growth direction of the barrier layer 14 for one up-and-down fluctuation, an Al component proportion is a molar ratio of Al component to Ga component in the barrier sub-layer.

A material of the channel layer 13 and a material of the barrier layer 14 include GaN-based material. The GaN-based material is a semiconductor material, such as GaN, AlGaN, AlInGaN, etc., that includes at least Ga atoms and N atoms. In this embodiment, the channel layer 13 can include GaN, the barrier layer 14 can include AlGaN or AlInGaN, the channel layer 13 and the barrier layer 14 form a heterojunction, and a two-dimensional electron gas is formed at an interface between the channel layer 13 and the barrier layer 14.

Further, the semiconductor structure further includes a substrate 10 arranged at a bottom of the semiconductor structure, where a material of the substrate 10 can include semiconductor material, ceramic material, or polymer material. In this embodiment, the material of the substrate 10 includes sapphire, carbonized silicon, silicon, lithium niobate, silicon on insulator (SOI), gallium nitride (GaN), or aluminum nitride (AlN). Taking a GaN-based semiconductor as an example, the GaN-based semiconductor can further include forming a nucleation layer 11 on the substrate 10 to reduce dislocation density and defect density, improve crystal quality, and other technical requirements, where a material the nucleation layer 11 can include one or more of AlN, AlGaN, or GaN. In addition, the GaN-based semiconductor structure can further include forming a buffer layer 12 on the nucleation layer 11 to buffer stresses in an epitaxial structure on the substrate and prevent the epitaxial structure from cracking, where a material of the buffer layer 12 can include one or more of GaN, AlGaN, or AlInGaN.

The semiconductor structure further includes a gate 16, a source 15, and a drain 17 provided on the barrier layer 14.

Figure 2:
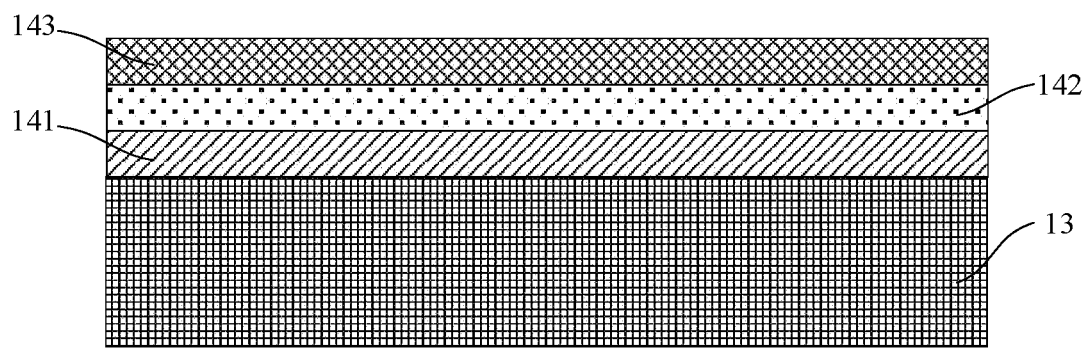
FIG. 2 is a cross-sectional schematic diagram of a channel layer and a barrier layer in a semiconductor structure according to embodiment 1 of the present application.
Figure 5:
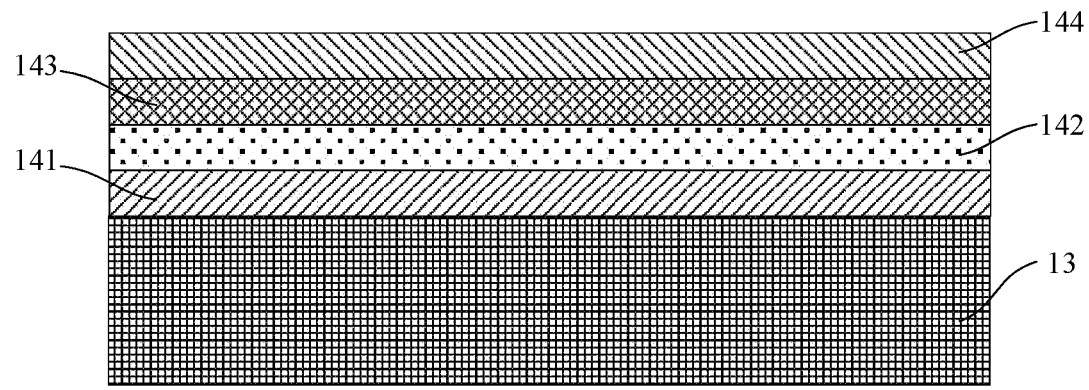
FIG. 5 is a cross-sectional schematic diagram of a channel layer and a barrier layer in a semiconductor structure according to embodiment 2 of the present application.
Figure 9:
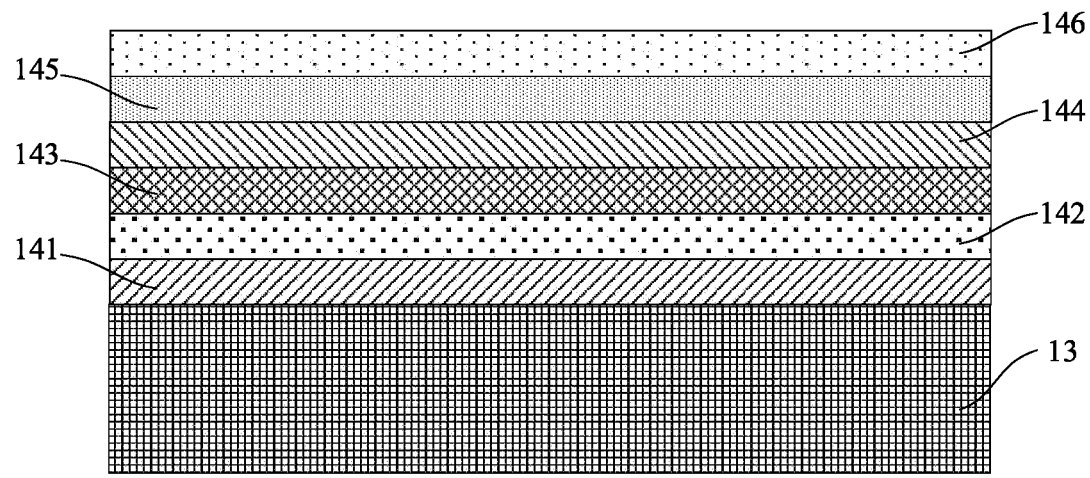
FIG. 9 is a cross-sectional schematic diagram of a channel layer and a barrier layer in a semiconductor structure according to embodiment 3 of the present application.

In embodiment 1 below, as shown in FIG. 2, the barrier layer 14 can include three barrier sub-layers, that is, a first barrier sub-layer 141, a second barrier sub-layer 142 and a third barrier sub-layer 143 arranged from bottom to top. But it is not limited to this. In embodiment 2 below, the barrier layer 14 can include four barrier sub-layers (as shown in FIG. 5). Alternately, in embodiment 3 below, the barrier layer 14 can include six barrier sub-layers (as shown in FIG. 9). In the present application, a number of barrier sub-layers is not limited, as long as the number of barrier sub-layers is not less than 3, and Al component proportions of the barrier sub-layers vary along the growth direction of the barrier layer for at least one up-and-down fluctuation. In this way, the Al component proportions of the multiple barrier sub-layers vary along the growth direction of the barrier layer for at least one up-and-down fluctuation, so that an energy band of the semiconductor structure forms one or more quantum wells in the barrier layer to avoid forward leakage.

In this technical solution, one up-and-down fluctuation is variations that the Al component proportions of the multiple barrier sub-layers vary from large to small, and then from small to large along the growth direction of the barrier layer, or variations that the Al component proportions of the multiple barrier sub-layers vary from small to large, and then from large to small along the growth direction of the barrier layer. Multiple up-and-down fluctuations include recurrent up-and-down fluctuation variations that the Al component proportions of the multiple barrier sub-layers vary from large to small, then from small to large, and continue to vary from large to small, and so on, along the growth direction of the barrier layer, or recurrent up-and-down fluctuation variations that the Al component proportions of the multiple barrier sub-layers vary from small to large, then from large to small, and continue to vary from small to large, and so on, along the growth direction of the barrier layer. A number of the multiple up-and-down fluctuations is the greater value between a number of Al component proportions discontinuous variations from small to large and a number of Al component proportions discontinuous variations from large to small in the multiple barrier sub-layers along the growth direction of the barrier layer. It is understood in conjunction with the following embodiments.

Various example embodiments of the present application will now be described in detail with reference to the accompanying drawings. It is to be understood that, unless specifically stated otherwise, the relative arrangement of components and steps, numerical expressions and numerical values set forth in these embodiments should not be construed as limiting the scope of the present application.

In addition, it is to be understood that, for ease of description, the dimensions of the various components shown in the drawings are not necessarily drawn in accordance with actual proportional relationships. For example, the thickness or width of some layers may be exaggerated relative to other layers.

Embodiment 1

With reference to FIG. 1 and FIG. 2, this embodiment provides a semiconductor structure. The semiconductor structure includes a substrate 10, a nucleation layer 11, a buffer layer 12, a channel layer 13, and a barrier layer 14 stacked in sequence, where a source 15, a drain 16, and a gate 17 are provided on the barrier layer 14.

A material of the channel layer 13 and a material of the barrier layer 14 include GaN-based material. The GaN-based material is a semiconductor material, such as GaN, AlGaN, AlInGaN, etc., that includes at least Ga atoms and N atoms. In this embodiment, the channel layer 13 can include GaN, the barrier layer 14 can include AlGaN or AlInGaN, the channel layer 13 and the barrier layer 14 form a heterojunction, and a two-dimensional electron gas is formed at an interface between the channel layer 13 and the barrier layer 14.

A material of the substrate 10 can include semiconductor material, ceramic material, or polymer material, etc. In this embodiment, the material of the substrate 10 includes sapphire, silicon carbide, silicon, lithium niobate, silicon on insulator (SOI), gallium nitride, or aluminum nitride. Taking a GaN-based semiconductor as an example, the GaN-based semiconductor can further include forming a nucleation layer 11 on the substrate 10 to reduce dislocation density and defect density, and improve crystal quality and other technical requirements, where a material of the nucleation layer 11 can include one or more of AlN, AlGaN, or GaN.

A material of the buffer layer 12 includes one or more of AlN, GaN, AlGaN or InGaN. By providing the buffer layer 12, stresses in an epitaxial structure on the substrate can be buffered, thereby cracking of the epitaxial structure can be avoided. The buffer layer 12 is formed on the nucleation layer 11.

The barrier layer 14 includes three barrier sub-layers arranged in a stack, and Al component proportions of the three barrier sub-layers vary along the growth direction of the barrier layer 14 for one up-and-down fluctuation.

The Al component proportions of the barrier sub-layers are from 0 to 1. A material of the barrier sub-layer containing Al component includes AlGaN or AlInGaN. The three barrier sub-layers include a first barrier sub-layer 141, a second barrier sub-layer 142, a third barrier sub-layer 143 that are sequentially stacked along the growth direction of the barrier layer. The Al component proportions of the three barrier sub-layers vary along the growth direction of the barrier layer 14 for one up-and-down fluctuation, that is, along the growth direction of the barrier layer, the Al component proportions of the three barrier sub-layers vary from large to small and then from small to large, or the Al component proportions of the three barrier sub-layers vary from small to large and then from large to small. That is, an Al component proportion of the second barrier sub-layer 142 is smaller than an Al component proportion of the first barrier sub-layer 141, and an Al component proportion of the third barrier sub-layer 143 is greater than the Al component proportion of the second barrier sub-layer 142. Alternately, the Al component proportion of the second barrier sub-layer 142 is greater than the Al component proportion of the first barrier sub-layer 141, and the Al component proportion of the third barrier sub-layer 143 is smaller than the Al component proportion of the second barrier sub-layer 142. A structure for the Al component proportions of the first barrier sub-layer 141, the second barrier sub-layer 142, and the third barrier sub-layer 143 meeting the above conditions can form a quantum well, thereby forward leakage is avoided.

In some embodiments, the Al component proportions of the three barrier sub-layers are different between each other. In this way, amplitudes of the up-and-down fluctuations are different, which can prevent forward leakage better.

Figure 3:
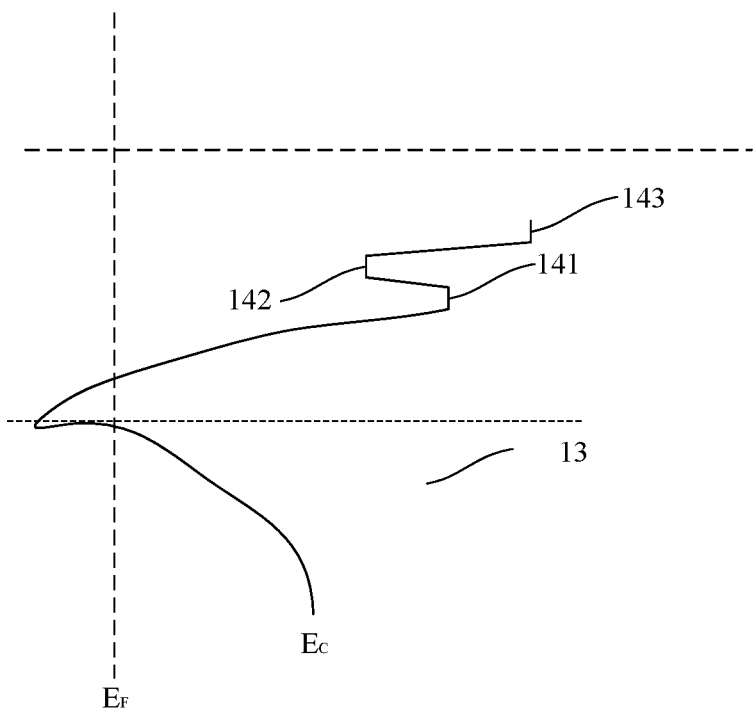
FIG. 3 is an energy band diagram for a channel layer and a barrier layer in a semiconductor structure according to embodiment 1 of the present application.

In this embodiment, the Al component proportion of the first barrier sub-layer 141 is 0.5, the Al component proportion of the second barrier sub-layer 142 is 0.2, and the Al component proportion of the third barrier sub-layer 143 is 0.8, and an energy band diagram of formed channel layer 13 and barrier layer 14 is shown in FIG. 3.

In some embodiments, an Al component proportion of a barrier sub-layer closest to the channel layer 13 among the three barrier sub-layers is greater than zero, that is, the Al component proportion of the first barrier sub-layer 141 is greater than zero. This is because a material of the channel layer 13 is GaN, by setting the Al component proportion of the barrier sub-layer closest to the channel layer 13 to be greater than zero, a quantum well can be better formed, thereby forward leakage of a semiconductor device is avoided.

In this embodiment, a thickness of each barrier sub-layer is from 0.25 nm to 15 nm; a total thickness of the barrier layer 14 is not less than 2 nm.

Embodiment 2

As shown in FIG. 4 and FIG. 5, an overall structure of a semiconductor structure of this embodiment is basically the same as the structure in embodiment 1, the difference is that the multiple barrier sub-layers include four barrier sub-layers, and the Al component proportions of the multiple barrier sub-layers vary along the growth direction of the barrier layer for two up-and-down fluctuations.

The four barrier sub-layers include a first barrier sub-layer 141, a second barrier sub-layer 142, a third barrier sub-layer 143, and a fourth barrier sub-layer 144 that are sequentially stacked along the growth direction of the barrier layer.

The Al component proportions of the four barrier sub-layers vary along the growth direction of the barrier layer 14 for two up-and-down fluctuations. That is, along the growth direction of the barrier layer, the Al component proportions of the four barrier sub-layers vary from large to small, then from small to large, and continue to vary from large to small. Alternately, along the growth direction of the barrier layer, the Al component proportions of the four barrier sub-layers vary from small to large, then from large to small, and continue to vary from small to large. That is, an Al component proportion of the second barrier sub-layer 142 is smaller than an Al component proportion of the first barrier sub-layer 141, and an Al component proportion of the third barrier sub-layer 143 is greater than the Al component proportion of the second barrier sub-layer 143, an Al component proportion of the fourth barrier sub-layer 144 is smaller than the Al component proportion of the third barrier sub-layer 143. Alternately, the Al component proportion of the second barrier sub-layer 142 is greater than the Al component proportion of the first barrier sub-layer 141, and the Al component proportion of the third barrier sub-layer 143 is smaller than the Al component proportion of the second barrier sub-layer 142, the Al component proportion of the fourth barrier sub-layer 144 is greater than the Al component proportion of the third barrier sub-layer 143. A structure for the Al component proportions of the first barrier sub-layer 141, the second barrier sub-layer 142, the third barrier sub-layer 143, and the fourth barrier sub-layer 144 meeting the above conditions can form two quantum wells, thereby forward leakage is avoided In some embodiments, the Al component proportions of three adjacent barrier sub-layers among the four barrier sub-layers are not equal each other. In this way, amplitudes of the up-and-down fluctuations are different, which can prevent forward leakage better.

Figure 6:
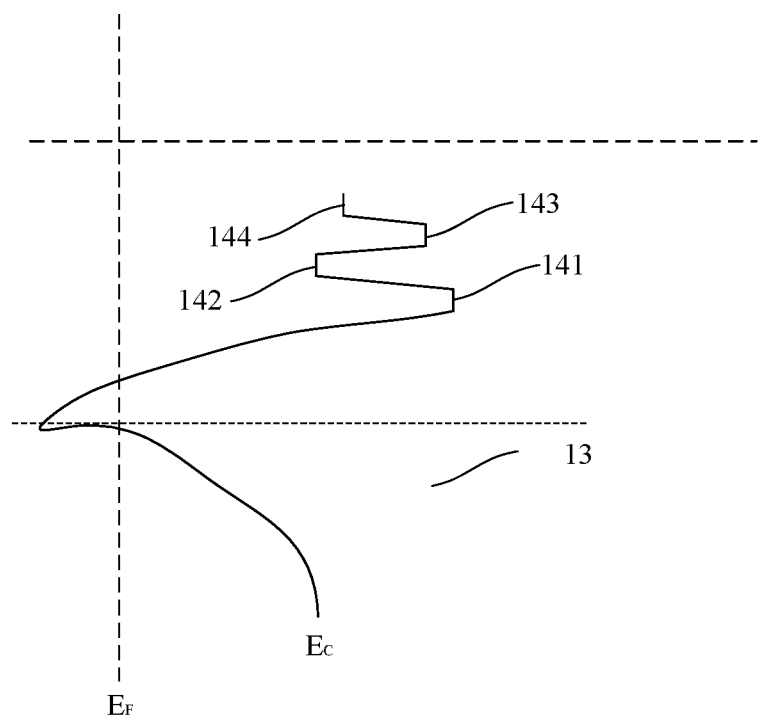
FIG. 6 is an energy band diagram for a channel layer and a barrier layer in a semiconductor structure according to embodiment 2 of the present application.

In this embodiment, the Al component proportion of the first barrier sub-layer 141 is 0.5, the Al component proportion of the second barrier sub-layer 142 is 0, the Al component proportion of the third barrier sub-layer 143 is 0.4, the Al component proportion of the fourth barrier sub-layer 144 is 0.1, and an energy band diagram of formed channel layer 13 and barrier layer 14 is shown in FIG. 6. It can be seen that the Al component proportion of the first barrier sub-layer 141 to the Al component proportion of the second barrier sub-layer 142 varies from large to small for a first time, the Al component proportion of the third barrier sub-layer 143 to the Al component proportion of the fourth barrier sub-layer 144 varies from large to small for a second time, interspersed with that the Al component proportion of the second barrier sub-layer 142 to the Al component proportion of the third barrier sub-layer 143 varies from small to large for one time, that is, variations of the Al component proportions of the four barrier sub-layers include two discontinuous variations from large to small, and one variation from small to large, at this time, a larger value (i.e., the two discontinuous variations from large to small) among the above two types of variations is used to count a number of up-and-down fluctuations, that is, variations of the Al component proportion of the four barrier sub-layers include two up-and-down fluctuations.

Figure 7:
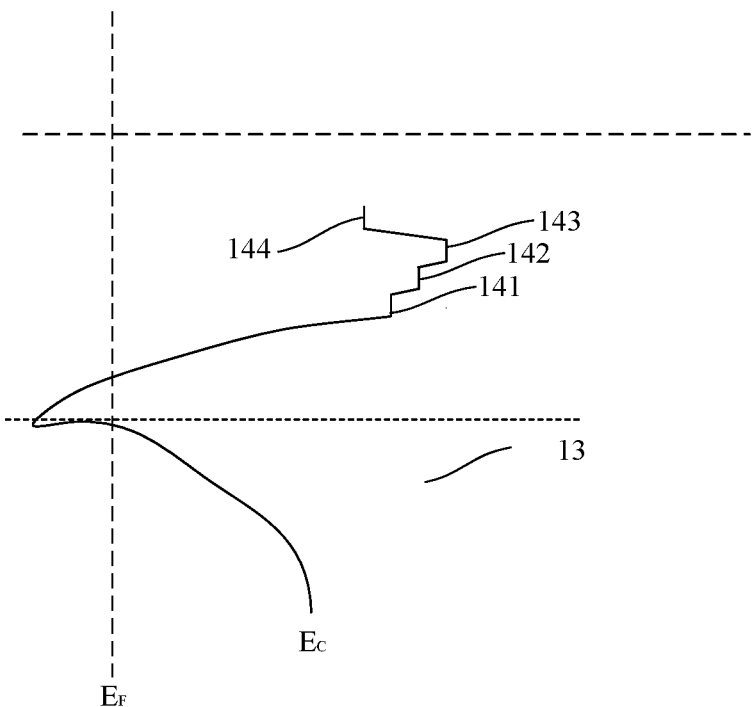
FIG. 7 is an energy band diagram for a channel layer and a barrier layer in a semiconductor structure according to another implementation of embodiment 2 of the present application.

In another implementation of this embodiment, when the Al component proportions of the four barrier sub-layers vary along the growth direction of the barrier layer for one up-and-down fluctuation, a quantum well can also be formed, thereby forward leakage is avoided. For example, the Al component proportion of the first barrier sub-layer 141 is 0.3, the Al component proportion of the second barrier sub-layer 142 is 0.4, the Al component proportion of the third barrier sub-layer 143 is 0.5, and the Al component proportion of the fourth barrier layer barrier sub-layer 144 is 0.2. As shown in FIG. 7, the Al component proportions from the first barrier sub-layer 141 to the third barrier sub-layer 143 are one variation from small to large, and the Al component proportions from the third barrier sub-layer 143 to the fourth barrier sub-layer 144 are one variation from large to small, thus there is only one up-and-down fluctuation.

Embodiment 3

As shown in FIG. 8 and FIG. 9, an overall structure of a semiconductor structure of this embodiment is basically the same as the structure in embodiment 1, the difference is that the multiple barrier sub-layers include six barrier sub-layers, and the Al component proportions of the multiple barrier sub-layers vary along the growth direction of the barrier layer for three up-and-down fluctuations.

The six barrier sub-layers include a first barrier sub-layer 141, a second barrier sub-layer 142, a third barrier sub-layer 143, a fourth barrier sub-layer 144, a fifth barrier sub-layer 145 and a sixth barrier sub-layer 146 that are sequentially stacked along the growth direction of the barrier layer.

The Al component proportions of the six barrier sub-layers vary along the growth direction of the barrier layer for three up-and-down fluctuations. That is, along the growth direction of the barrier layer, there are recurrent up-and-down fluctuation variations that the Al component proportions of the six barrier sub-layers vary from large to small, then from small to large, and continue to vary from large to small, and so on. Alternately, along the growth direction of the barrier layer, there are recurrent up-and-down fluctuation variations that the Al component proportions of the six barrier sub-layers vary from small to large, then from large to small, and continue to vary from small to large, and so on. That is, an Al component proportion of the second barrier sub-layer 142 is smaller than an Al component proportion of the first barrier sub-layer 141, an Al component proportion of the third barrier sub-layer 143 is larger than an Al component proportion of the second barrier sub-layer 142, an Al component proportion of the fourth barrier sub-layer 144 is smaller than the Al component proportion of the third barrier sub-layer 143, and so on. Alternately, the Al component proportion of the second barrier sub-layer 142 is greater than the Al component proportion of the first barrier sub-layer 141, the Al component proportion of the third barrier sub-layer 143 is smaller than the Al component proportion of the second barrier sub-layer 142, the Al component proportion of the fourth barrier sub-layer 144 is greater than the Al component proportion of the third barrier sub-layer 143, and so on. A structure for the Al component proportions of the first barrier sub-layer 141, the second barrier sub-layer 142, the third barrier sub-layer 143, the fourth barrier sub-layer 144, the fifth barrier sub-layer 145, and the sixth barrier sub-layer 146 meeting the above conditions can form three quantum wells, thereby forward leakage is avoided.

Figure 10:
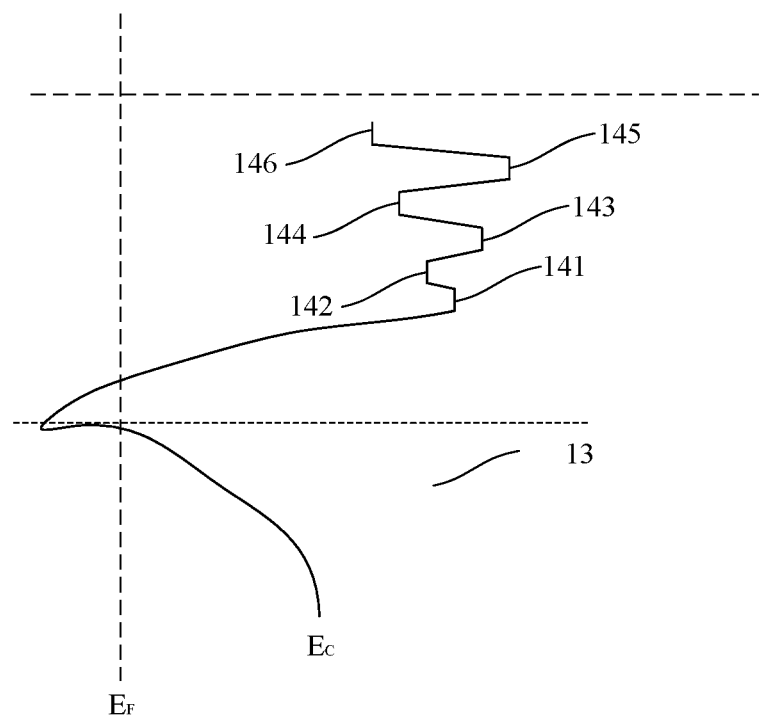
FIG. 10 is an energy band diagram for a channel layer and a barrier layer in a semiconductor structure according to embodiment 3 of the present application.

In this embodiment, amplitudes of the three up-and-down fluctuations gradually increase along the growth direction of the barrier layer 14. For example, the Al component proportion of the first barrier sub-layer 141 is 0.5, the Al component proportion of the second barrier sub-layer 142 is 0.4, the Al component proportion of the third barrier sub-layer 143 is 0.6, the Al component proportion of the fourth barrier sub-layer 144 is 0.3, the Al component proportion of the fifth barrier sub-layer 145 is 0.7, and the Al component proportion of the sixth barrier sub-layer 146 is 0.2. An energy band diagram of formed channel layer 13 and barrier layer 14 is shown in FIG. 10. In this way, as the amplitudes of the up-and-down fluctuations gradually increase along the growth direction of the barrier layer 14, the generated quantum wells increase gradually, so that forward leakage can be avoided better.

Figure 11:
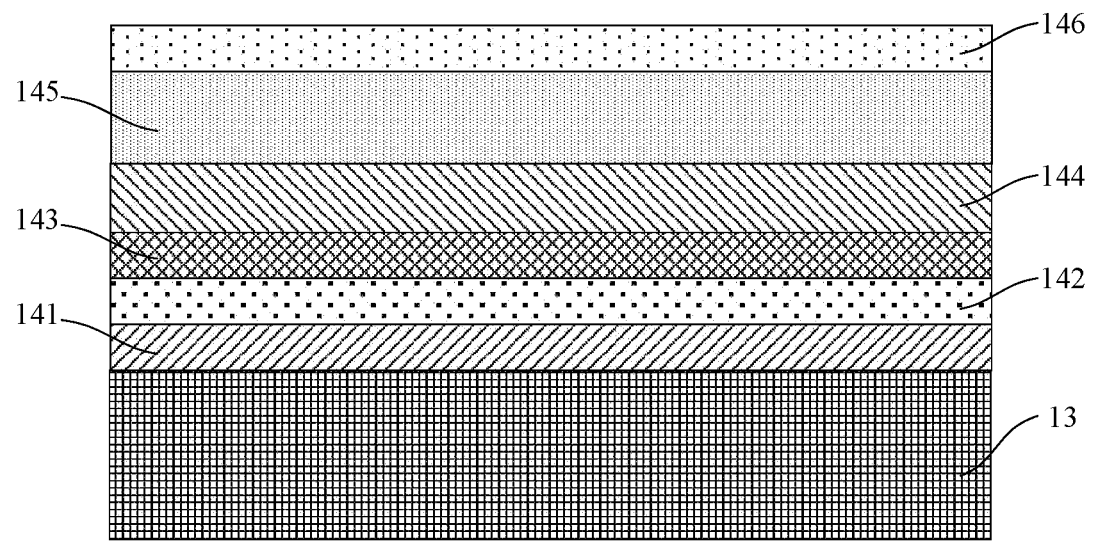
FIG. 11 is a cross-sectional schematic diagram of a channel layer and a barrier layer in a semiconductor structure according to another implementation of embodiment 3 of the present application.

In another implementation of this embodiment, as shown in FIG. 11, thicknesses of the fourth barrier sub-layer 144 and the fifth barrier sub-layer 145 of the six barrier sub-layers can be greater than thicknesses of other barrier sub-layers, but not limited to this, the thicknesses of the six barrier sub-layers can be different, partly the same, or all the same. The thickness of the barrier sub-layer has less influence on the generated quantum wells, so it is not limited here.

Figure 12:
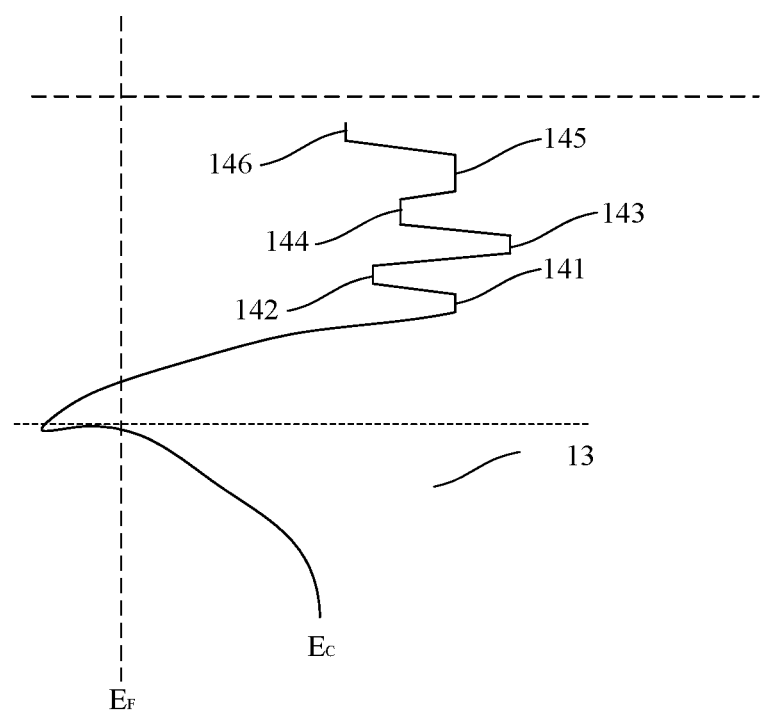
FIG. 12 is an energy band diagram for a channel layer and a barrier layer in a semiconductor structure according to another implementation of embodiment 3 of the present application.
Figure 13:
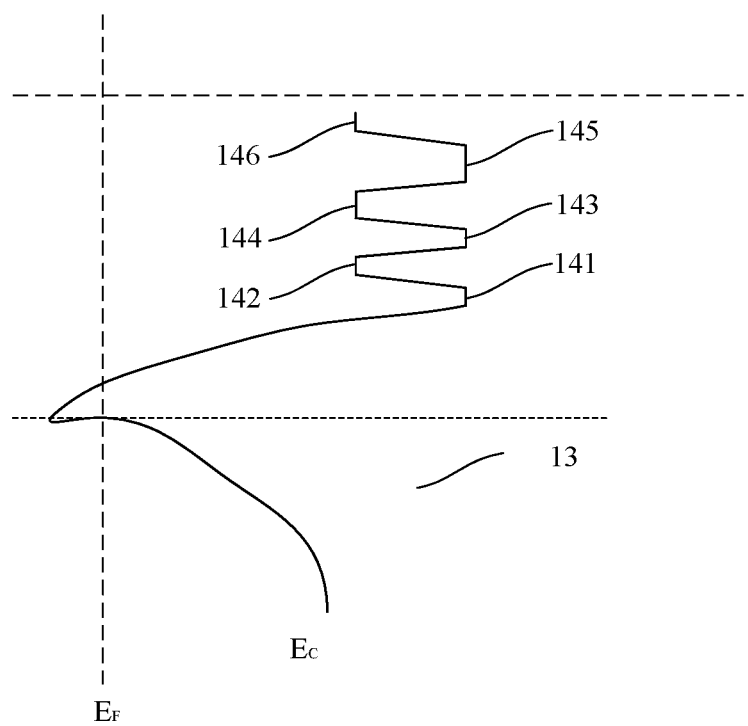
FIG. 13 is an energy band diagram for a channel layer and a barrier layer in a semiconductor structure according to another implementation of embodiment 3 of the present application.

Continuing, the Al component proportions of the six barrier sub-layers are not limited to the limit in this embodiment, the Al component proportion of the first barrier sub-layer 141 can be 0.5, the Al component proportion of-the second barrier sub-layer 142 can be 0.2, the Al component proportion of the third barrier sub-layer 143 can be 0.7, the Al component proportion of the fourth barrier sub-layer 144 can be 0.3, the Al component proportion of the fifth barrier sub-layer 145 can be 0.5, and the Al proportion of the sixth barrier sub-layer 146 can be −0.1. An energy band diagram of formed channel layer 13 and barrier layer 14 is shown in FIG. 12. Three quantum wells are also generated to prevent forward leakage. In addition, the Al component proportions of different barrier sub-layers can also have the same Al component proportion, for example, the Al component proportions of the first barrier sub-layer 141, the third barrier sub-layer 143, and the fifth barrier sub-layer 145 all can be 0.6, while the Al component proportions of the second barrier sub-layer 142, the fourth barrier sub-layer 144, and the sixth barrier sub-layer 146 all can be 0.2, as shown in FIG. 13, three quantum wells can also be generated to prevent forward leakage.

The above description is only preferred examples of the present application, and is not intended to limit the present application. Any modifications, equivalent substitutions, improvements, etc., which are made within the spirit and principle of the present application, shall be included in the protection scope of the present application.

The invention claimed is:

1. A semiconductor structure, comprising:
a channel layer; and
a barrier layer provided on the channel layer,
wherein the barrier layer comprises multiple barrier sub-layers arranged in a stack, the multiple barrier sub-layers comprise at least three barrier sub-layers, and Al component proportions of the multiple barrier sub-layers vary along a growth direction of the barrier layer for at least one up-and-down fluctuation;
wherein the Al component proportions of the multiple barrier sub-layers are from 0 to 1.

2. The semiconductor structure of claim 1, wherein the Al component proportions of adjacent three barrier sub-layers among the multiple barrier sub-layers are different between each other.

3. The semiconductor structure of claim 1, wherein the multiple barrier sub-layers comprise at least four barrier sub-layers, and the Al components proportions of the multiple barrier sub-layers vary along the growth direction for at least two up-and-down fluctuations.

4. The semiconductor structure of claim 3, wherein the Al component proportions of adjacent three barrier sub-layers among the multiple barrier sub-layers are different between each other.

5. The semiconductor structure of claim 4, wherein amplitudes of the at least two up-and-down fluctuations gradually increase along the growth direction of the barrier layer.

6. The semiconductor structure of claim 1, wherein an Al component proportion of a barrier sub-layer closest to the channel layer among the multiple barrier sub-layers is greater than zero.

7. The semiconductor structure of claim 1, further comprising:
a substrate;
a nucleation layer; and
a buffer layer; wherein the substrate, the nucleation layer, the buffer layer, the channel layer, and the barrier layer are arranged in a stack, and a source, a drain, and a gate are provided on the barrier layer.

8. The semiconductor structure of claim 7, wherein a material of the substrate comprises one or more of silicon, silicon carbide, sapphire, GaN, AlN, lithium niobate, or silicon on insulator.

9. The semiconductor structure of claim 7, wherein a material of the buffer layer comprises one or more of AlN, GaN, AlGaN, or InGaN.

10. The semiconductor structure of claim 1, wherein a material of the barrier sub-layer containing Al component comprises AlGaN or AlInGaN.

11. The semiconductor structure of claim 1, wherein a material of the channel layer comprises AlGaN or AlInGaN.

12. The semiconductor structure of claim 1, wherein a thickness of each of the multiple barrier sub-layers is from 0.25 nm to 15 nm and a total thickness of the barrier layer is not less than 2 nm.

13. The semiconductor structure of claim 1, wherein thicknesses of the multiple barrier sub-layers are different.

14. The semiconductor structure of claim 1, wherein thicknesses of the multiple barrier sub-layers are partly same.

15. The semiconductor structure of claim 1, wherein thicknesses of the multiple barrier sub-layers are all same.

16. The semiconductor structure of claim 1, wherein the multiple barrier sub-layers comprise six barrier sub-layers arranged along the growth direction of the barrier layer, and the Al component proportions of the multiple barrier sub-layers vary along the growth direction of the barrier layer for three up-and-down fluctuations.

17. The semiconductor structure of claim 16, wherein Al component proportions of a first barrier sub-layer, a third barrier sub-layer, and a fifth barrier sub-layer of the multiple barrier sub-layers are a first value, and the Al component proportions of a second barrier sub-layer, a fourth barrier sub-layer, and a sixth barrier sub-layer of the multiple barrier sub-layers are a second value.

18. The semiconductor structure of claim 16, wherein thicknesses of a fourth barrier sub-layer and a fifth barrier sub-layer of the six barrier sub-layers are greater than thicknesses of other barrier sub-layers of the multiple barrier sub-layers.

19. The semiconductor structure of claim 16, wherein amplitudes of the three up-and-down fluctuations gradually increase along the growth direction of the barrier layer.

\* \* \* \* \*